(12) United States Patent
Aton

(10) Patent No.: US 8,475,976 B2
(45) Date of Patent: Jul. 2, 2013

(54) METHOD OF FABRICATING INTEGRATED CIRCUIT USING ALTERNATING PHASE-SHIFT MASK AND PHASE-SHIFT TRIM MASK

(75) Inventor: Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/906,861

(22) Filed: Oct. 18, 2010

(65) Prior Publication Data

US 2011/0033785 A1    Feb. 10, 2011

Related U.S. Application Data

(63) Continuation of application No. 11/001,165, filed on Dec. 1, 2004, now abandoned.

(51) Int. Cl.
*G03F 1/00* (2006.01)
*H01L 21/02* (2006.01)

(52) U.S. Cl.
USPC .............................. 430/5; 430/311; 430/394

(58) Field of Classification Search
USPC ............................................. 430/5, 311, 394
See application file for complete search history.

(56) References Cited

U.S. PATENT DOCUMENTS

| | | | |
|---|---|---|---|
| 6,551,750 B2 | 4/2003 | Pierrat | |
| 6,569,727 B1 * | 5/2003 | Casper et al. | 438/210 |
| 2004/0074868 A1 | 4/2004 | Chang | |
| 2004/0081897 A1 * | 4/2004 | Koike | 430/5 |
| 2004/0219436 A1 | 11/2004 | Zhang | |

OTHER PUBLICATIONS

Risius, Eric, University of Wisconsin—Madison; Current Industrial Collaborators, Mark Mason, Texas Instruments; Additional Support provided by DARPA and SRC; "Optical Mask Modeling Update, Mechanical Modeling of Attenuated Phase-Shifting Masks"; May 4, 2000, pp. 1-13.

Ushida, Masao et al., "Photomask Blanks Quality and Functionality Improvement Challenges for the 130 nm Node and Below"; Special Focus Lithography; Yield Management Solutions; Autumn 2000; pp. 47-50.

"Phase Shift Masks [PSM], A Primer on Phase Shift Masks, The Productivity Paradox"; DuPont Photomasks, Inc., Copyright 2000-2004 DuPont Photomasks, Inc.; 4 pages.

Van Den Broeke, Douglas, Photronics, Inc., California; "Transferring Phase-Shifting Mask Technology into Mainstream Manufacturing"; 8 pages.

(Continued)

*Primary Examiner* — Jonathan Jelsma
(74) *Attorney, Agent, or Firm* — Alan A. R. Cooper; Wade J. Brady, III; Frederick J. Telecky, Jr.

(57) ABSTRACT

An integrated circuit is fabricated using photolithography by selectively exposing a photoresist layer to pattern a coarse line region of a wafer layer using a trim mask, and to pattern a fine line region of the wafer layer using an alternating phase-shift mask. The trim mask includes transparent, attenuated phase-shift and opaque regions. The phase-shifted attenuated light region patterns the coarse line region and the opaque region keeps light from exposing the fine line region. The alternating phase-shift mask patterns only the fine line region and includes one or more alternating phase-shift regions that each overlaps at least a portion of the opaque region but does not overlap the attenuated phase-shift region. The alternating phase-shift mask may be used to pattern the trim mask.

16 Claims, 5 Drawing Sheets

OTHER PUBLICATIONS

Lee, Jung-Kwan et al., "Detection Capability for Chrome Defect of Tri-tone PSM"; Photomask R&D Center, Korea; 7 pages.
Bailey, George E. et al., "Dark field high transmission chromeless lithography"; 12 pages.
Mack, Chris A., "Phase-Shift Masks", Field Guide to Optical Lithography, ISBN: 9780819462077, SPIE Press, Bellingham, WA, 2006, pp. 78-80.

* cited by examiner

METHOD OF FABRICATING INTEGRATED CIRCUIT USING ALTERNATING PHASE-SHIFT MASK AND PHASE-SHIFT TRIM MASK

This is a continuation of U.S. application Ser. No. 11/001, 165, filed Dec. 1, 2004, the entirety of which is incorporated herein by reference.

BACKGROUND

This invention relates generally to the field of photolithography and more specifically to a trim mask for an alternating phase-shift exposure system.

A photolithography mask may be used to pattern an object such as a semiconductor wafer of an integrated circuit. The mask may be positioned between a light source and the object. Light from the light source is selectively transmitted, blocked, or otherwise affected by the mask to define a pattern on the object. A mask such as an embedded attenuated phase-shift mask includes attenuated phase-shift regions. An attenuated phase-shift region transmits a small percentage of light and shifts the phase of transmitted light. Light passing through an attenuated phase-shift region may destructively interfere with light passing through an adjacent transparent region, which may allow for higher resolution pattern definition in certain situations. Embedded attenuated phase-shift masks, however, do not provide for high resolution pattern definition in other situations. It is generally desirable to have high resolution pattern definition in a variety of situations.

SUMMARY

According to one embodiment of the invention, a photolithography trim mask for patterning a wafer includes a transparent region, an attenuated phase-shift region, and an opaque region. The transparent region substantially transmits received light. The attenuated phase-shift region transmits a portion of received light and shifts the phase of the transmitted light. The shifted light patterns a coarse line region of a pattern. The opaque region substantially prevents received light from exposing a fine line region of the pattern. The fine line region is patterned by a separate alternating phase-shift mask.

Certain embodiments of the invention may provide one or more technical advantages. A technical advantage of one embodiment may be that a trim mask may include attenuated phase-shift, opaque, and transparent regions. An attenuated phase-shift region may be used to pattern a coarse line region of a pattern. The attenuated phase-shift region may provide for higher precision patterning of the coarse line region than an opaque region can provide. A fine line region of the pattern may be left unexposed by an opaque region of a trim mask during one exposure, and patterned by an alternating phase-shift mask during another exposure. The opaque region may protect the fine line region from exposure to light, which may allow for effective exposure of the fine line region by the phase-shift mask.

DETAILED DESCRIPTION OF EXAMPLE EMBODIMENTS

Example embodiments of the invention are described with reference to FIGS. 1A through 3B.

Figure 1A:
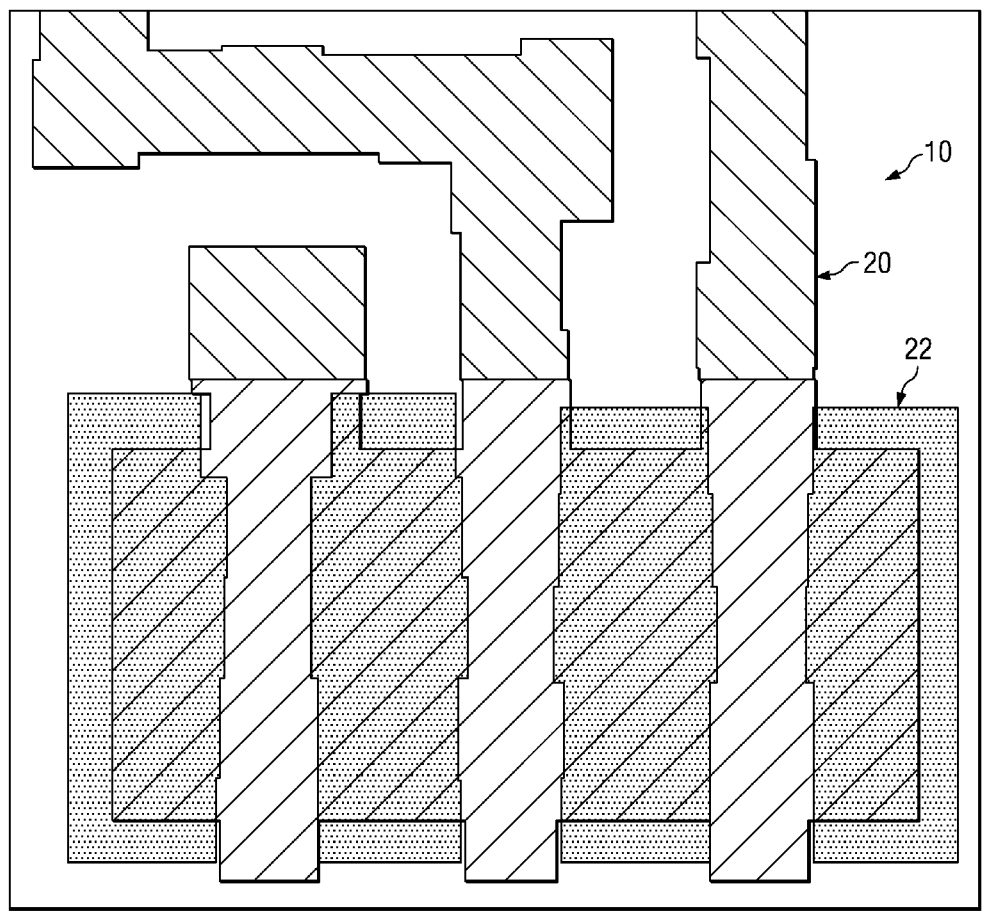
FIG. 1A illustrates an example mask set.

FIG. 1A illustrates an example mask set 10. A mask set may refer to one or more photolithography masks that may be used to pattern an object such as a semiconductor wafer used in the fabrication of an integrated circuit or the like. Mask set 10 may be positioned between a light source and the object. Light from the light source is selectively transmitted, blocked, phase shifted, or otherwise affected by mask set 10 to pattern the object. For example, a pattern may be defined on a resist layer of a wafer to generate features of an integrated circuit. The size and shape of mask set 10 determine the size and shape of the pattern. Mask set 10 may be of any appropriate size or shape for creating a pattern of any suitable size or shape on the object.

According to one embodiment, mask set 10 may be used to pattern a gate pattern of a circuit such as a CMOS integrated circuit. A pattern may include fine line regions, where the pattern is narrow or requires very precise patterning, and coarse line regions, where the pattern is wide or requires significantly less precise patterning. An example of a fine line region includes a gate or transistor region of a CMOS integrated circuit. A narrow width, precisely controlled polysilicon layer is patterned to partially cover the active or diffusion regions of a semiconductor substrate to form a gate. An example of a coarse line region includes an interconnect region. The interconnect regions at least partially connect the transistor regions to the external world. Other examples of fine line and coarse line patterning include fine interconnects coupled with coarse power bussing on a metal layer of an integrated circuit.

According to the illustrated embodiment, mask set 10 includes a trim mask 20 and an alternating phase-shift mask 22. Trim mask 20 and alternating phase-shift mask 22 may each be used to condition the light as part of the patterning process. For example, trim mask 20 may be used to condition the light during a first exposure, and alternating phase-shift mask 22 may be used to condition the light during a second exposure.

According to one embodiment, trim mask 20 may include regions that are substantially transparent, regions characterized as attenuated phase-shift regions, and regions that are substantially opaque. Trim mask 20 and alternating phase-shift mask 22 are described in more detail with reference to FIGS. 1B and 1C.

According to a known technique, an alternating phase/trim mask set includes an alternating phase-shift mask and a bi-tone trim mask. A bi-tone trim mask typically has transparent and opaque regions. During a first exposure, the transparent regions pattern the coarse line regions, and the opaque regions shield the fine line regions. During a second exposure, the fine line regions are patterned by the alternating phase-shift mask. In certain situations, however, the bi-tone trim mask cannot pattern the coarse line regions with sufficient resolution.

According to another known technique, the bi-tone trim mask may include phase-shift mask regions and transparent regions. The phase-shift mask regions of the trim mask, however, do not sufficiently shield the fine line regions, significantly reducing the contrast and resolution of the fine line regions.

Figure 1B:
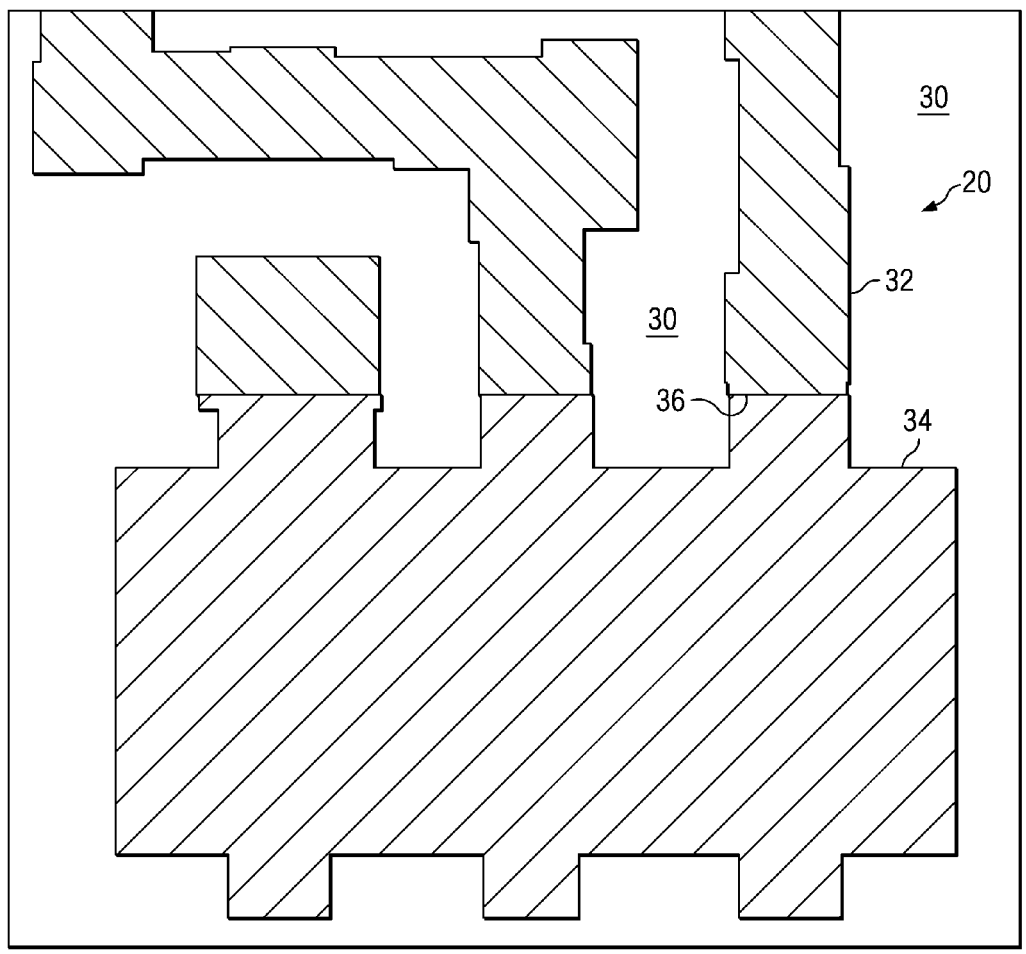
FIGS. 1B and 1C illustrate example trim masks of the mask set of FIG. 1.

FIG. 1B is illustrates an example trim mask 20 of mask set 10 of FIG. 1. Trim mask 20 includes a transparent region 30, an attenuated phase-shift region 32, and an opaque region 34. Regions 30, 32, and 34 may have any suitable size or shape. Transparent region 30 transmits substantially all light from the light source. Typically, transparent region 30 transmits light to allow for removal of a resist layer on a wafer. Transparent region 30 may comprise any suitable substantially transparent material operable to transmit substantially all light, such as quartz. The transparent material may form a substrate for trim mask 20.

Attenuated phase-shift region 32 acts to transmit only a portion of the received light to the object. When suitably illuminated, attenuated phase-shift region 32 shifts the phase of the transmitted light by an amount suitable to produce destructive interference with other light diffracted around the edges of the attenuated phase-shift region 32.

Attenuated phase-shift region 32 may comprise any suitable attenuated phase-shift material. An attenuated phase-shift material may refer to a material that transmits approximately two to fifteen percent of received light, and shifts the phase of the transmitted light by, for example, approximately 180°. As an example, an attenuated phase-shift material may transmit less than ten percent of the light such as less than eight, six, four, or three percent of the light. An attenuated phase-shift material may comprise molybdenum silicide (MoSiOxNy), a chromium-based material, or other suitable material, depending on the wavelength of the patterning light. Attenuated phase-shift region 32 may be formed by an attenuated phase-shift layer comprising an attenuated phase-shift material. The attenuated phase-shift layer may be disposed outwardly from the substrate of trim mask 20.

The phase of light passing through attenuated phase-shift region 32 may be shifted by an amount, typically approximately 180°, with respect to the phase of light passing through transparent region 30. The light passing through attenuated phase-shift region 32 may destructively interfere with light passing through an adjacent transparent region 30. The interference may provide for higher resolution pattern definition or higher contrast pattern resolution.

Opaque region 34 blocks substantially most or all light to prevent the light from reaching the object. Typically, opaque region 34 blocks light in order to leave the resist layer on a wafer unexposed. Opaque region 34 may comprise any suitable opaque material operable to substantially block the transmission of light, for example, chromium. Opaque region 34 may be formed by an opaque layer comprising an opaque material. The opaque layer may be disposed outwardly from the substrate of trim mask 20.

Opaque region 34 may include other layers, for example, an attenuated phase-shift layer. For example, the opaque layer may be disposed between an attenuated phase shift layer and a transparent substrate, or may be disposed outwardly from an attenuated phase-shift layer that is disposed outwardly from a transparent substrate. Opaque region may comprise any suitable arrangement of layers, with or without the addition of an attenuated phase-shift layer, that blocks substantially most or all direct transmission of light.

Opaque region 34 is designed to shield fine line regions from the trim mask exposure so that only phase-shift mask 22 substantially exposes these regions, so the size and shape of opaque region 34 may correspond to the size and shape of phase-shift mask 22. A boundary 36 between attenuated phase-shift region 32 and opaque region 34 may be placed such that attenuated phase-shift region 32 and phase-shift mask 22 pattern the same regions. Boundary 36, however, may be placed at any suitable location.

Figure 1C:
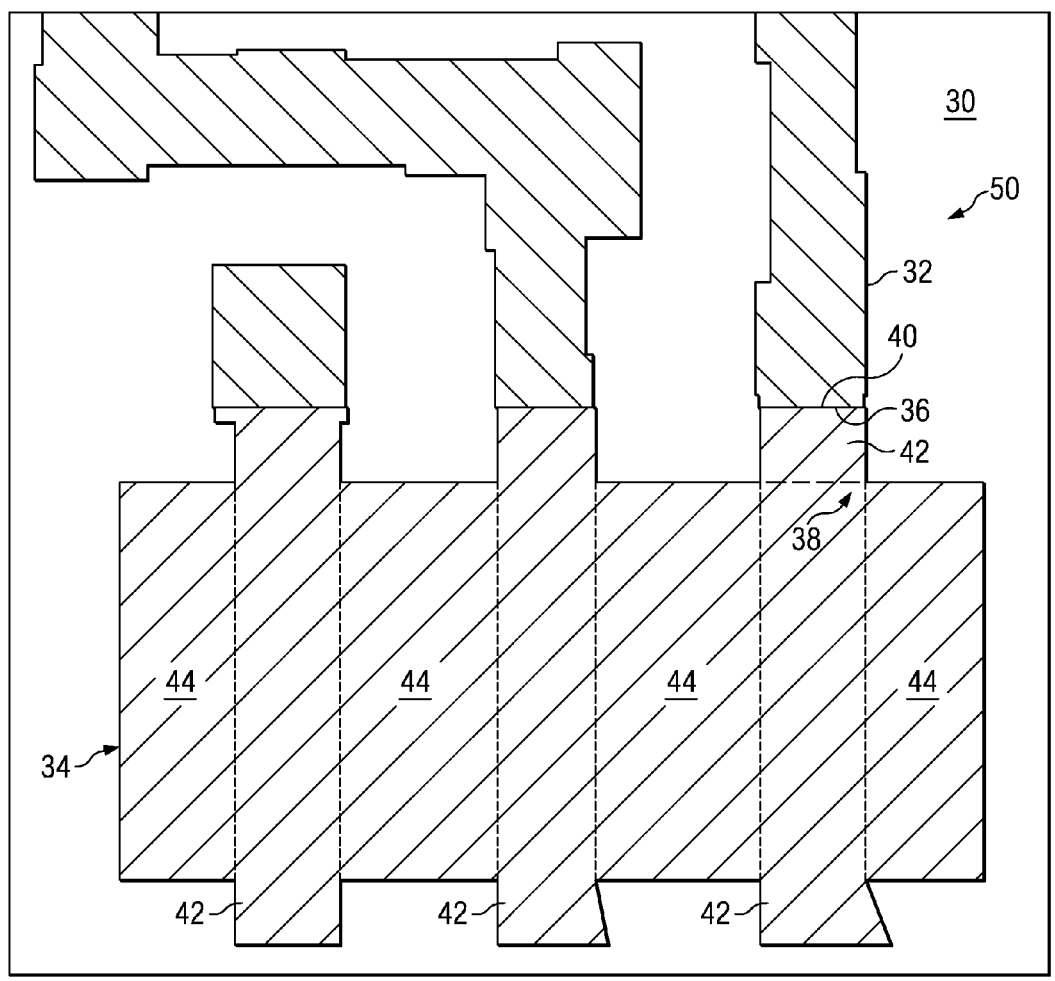

FIG. 1C illustrates another example trim mask 50 of mask set 10 of FIG. 1A. Trim mask 50 includes tabs 42 and wings 44. Tabs 42 extend from the opaque regions to protect end projections of the fine line regions. Tabs 42 may be opaque, attenuated, or a combination of opaque and attenuated. Wings 44 are extensions that widen the opaque region to shield the fine line regions. Wings 44 may be fully opaque, partially opaque, or any suitable combination of opaque and attenuated. A boundary 36 between the opaque and attenuated regions may be placed at the base 38 of a wing 44. Boundary 36 may be placed at any suitable distance 40 along an extension that joins a fine line region with a coarse line region. Phase-shift mask 22 may be used to pattern trim mask 20 as described with reference to FIGS. 2A through 2C.

Figure 1D:
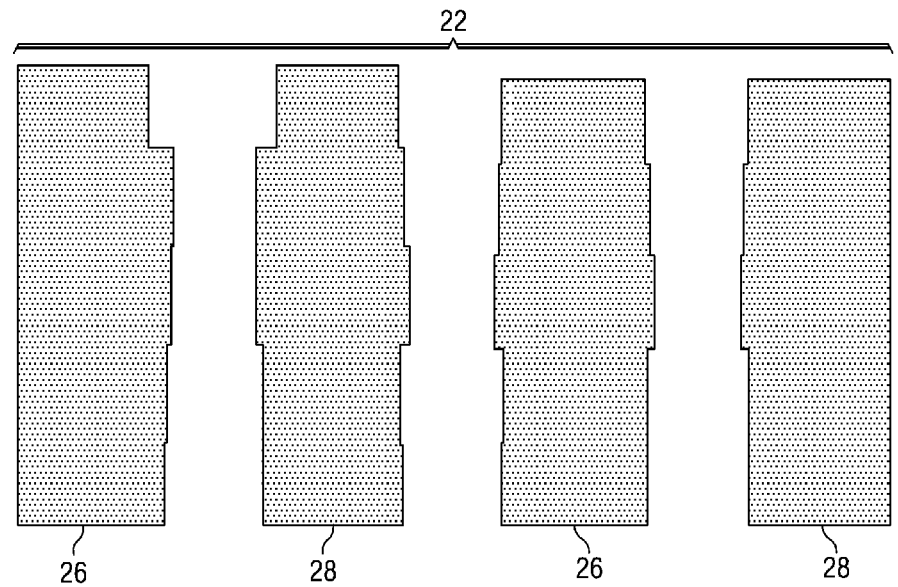
FIG. 1D illustrates an example alternating phase-shift mask of the mask set of FIG. 1.

FIG. 1D illustrates an example alternating phase-shift mask 22 that includes zero phase regions 26 and pi phase regions 28. Phase-shift mask 22 selectively alters the phase of light to create controlled destructive interference that may improve resolution and depth of focus. Light passing through zero phase regions 26 is 180° out of phase from light passing through pi phase regions 28. Light passing through a zero phase region 26 and an adjacent pi phase region 28 destructively interferes. Zero phase regions 26 and pi phase regions 28 may be created by etching a substrate, such as a quartz substrate, to a precise depth to create the appropriate phase shift. The depth depends on the wavelength of the light.

Modifications, additions, or omissions may be made to mask set 10 without departing from the scope of the invention. As used in this document, "each" refers to each member of a set or each member of a subset of a set.

Figure 2A:
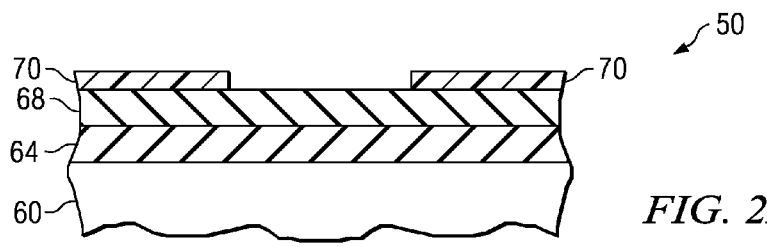
FIGS. 2A through 2E are cross-sectional views illustrating steps in a method of forming an example trim mask.

FIGS. 2A through 2E illustrate steps in fabrication of an example trim mask 50. As seen in FIG. 2A, mask 50 may include one or more layers deposited onto an outward surface of a substrate 60. For example, an attenuated phase-shift layer 64 may be deposited onto the outer surface of substrate 60, and an opaque layer 68 may be deposited over the outer surface of attenuated phase-shift layer 64. Any suitable order of layers, however, may be used. One or more passes of a photoresist layer 70 may be deposited over either of the layers and patterned in order to selectively produce the regions of transparent, opaque, and attenuated regions.

According to one embodiment, substrate 60 may comprise any suitable transparent material such as quartz. Substrate 60 may have any suitable thickness. Attenuated phase-shift layer 64 may comprise any suitable attenuated phase-shift material operable to block most light and to shift the phase of the light approximately 180°. For example, attenuated phase-shift layer may comprise molybdenum silicide. Attenuated phase-shift layer 64 may have any suitable thickness. Opaque layer 68 may comprise any suitable opaque material operable to substantially block light. For example, opaque layer 68 may comprise chromium. Opaque layer 68 may have any suitable thickness.

Photoresist layer 70 may comprise any suitable material such as a resin that is initially insoluble in a developer but becomes soluble when exposed to light or another energy source. Photoresist layer 70, however, may alternatively comprise a material that becomes insoluble when exposed. Photoresist layer 70 may have any suitable thickness. After deposition, resist layer 70 may be cured using any suitable technique such as baking. Portions of photoresist layer 70 exposed to light may undergo a wavelength-specific, radiation-sensitive chemical reaction to create the mask pattern of mask 50. Portions of photoresist layer 70 may also be exposed by electrons, protons, or other charged or uncharged particles.

Layers may be formed outwardly from substrate 60 using any suitable method. For example, layers may be deposited using conventional oxidation or deposition techniques such as chemical vapor deposition or physical vapor deposition techniques.

Figure 2B:
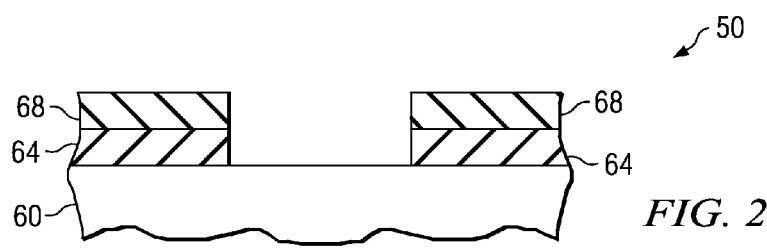

FIG. 2B illustrates mask 50 after an etch process. Mask 50 may be etched using any suitable process such as a dry etching technique, a wet etching technique, or both. As an example, if attenuated phase-shift layer 64 comprises molybdenum silicide, layer 64 may be dry etched in a reactive ion etching system. As another example, if attenuated phase-shift layer 64 comprises chromium, attenuated phase-shift layer 64 may be wet etched. Photoresist layer 70 may also be removed.

Figure 2C:
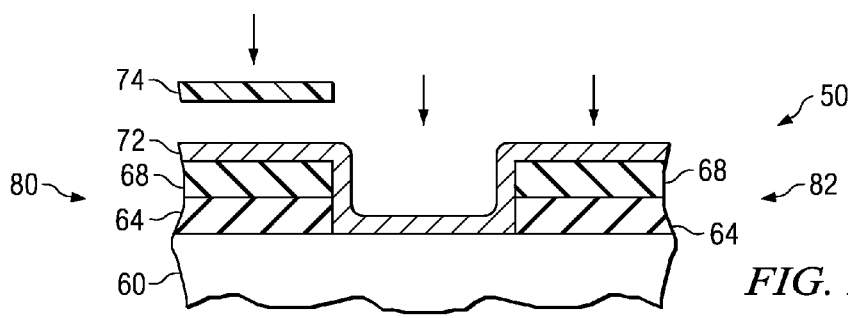

FIG. 2C illustrates mask 50 during the formation and patterning of resist layer 72. Resist layer 72 may be deposited onto opaque layer 68 in any suitable manner. The deposited resist layer 72 is patterned by passing light through a mask 74 to define an opaque region 80 and an attenuated phase-shift region 82. Phase-shift mask 22 (FIG. 1D) may be used to pattern trim mask 20. Exposure may be by photons, electrons, protons, or other energy transfer. Exposed regions may retain resist to protect underlying regions or cause resist to disappear exposing underlying regions according to the type (positive or negative) of resist used.

Figure 2D:
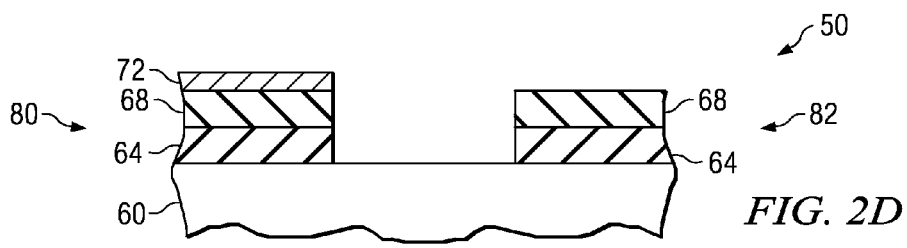

FIG. 2D illustrates mask 50 after removal of exposed portions of a positive resist layer 72 after patterning. The exposed portions of resist layer 72 may be removed by any suitable process. Portions of opaque layer 68 left exposed after removal of the exposed portions of resist layer 72 may be removed using any suitable etching process to form attenuated phase-shift region 82.

Figure 2E:
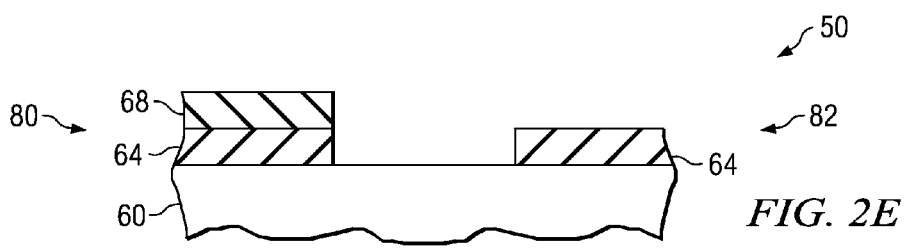

FIG. 2E illustrates example trim mask 50 after removal of the remaining (unexposed) portions of resist layer 72 to yield opaque region 80. The remaining resist layer 72 may be removed by any suitable process.

Modifications, additions, or omissions may be made to the method without departing from the scope of the invention. The method may include more, fewer, or other steps. Additionally, steps may be performed in any suitable order without departing from the scope of the invention. For example, attenuated phase-shift layer 64 may be deposited outwardly from opaque layer 68. As another example, any suitable exposure process may be used.

As an example, another embodiment of the method exposes, develops the resist, and then etches into a hard mask. A hard mask may refer to a layer of silicon dioxide on silicon nitride. Then, the method strips the resist, recoats, exposes, develops the resist, and then etches the hard mask. Finally, the hard mask finished pattern is transferred to a lower layer of the wafer, and the hard mask is removed.

Figure 3A:
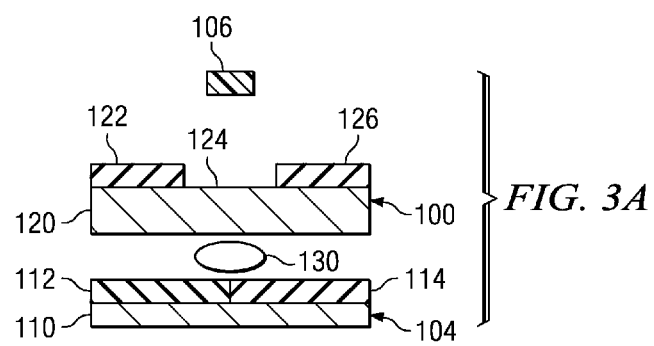
FIGS. 3A and 3B are cross-sectional views illustrating exposure of a wafer using an example trim mask and an example alternating phase-shift mask.
Figure 3B:
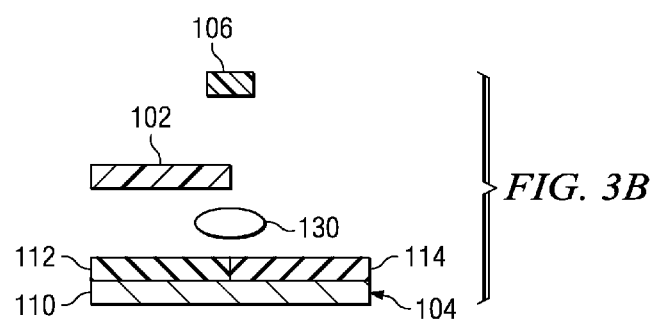

FIGS. 3A and 3B illustrate exposure of a wafer 104 through lenses 130 using a trim mask 100 and an alternating phase-shift mask 102. Referring to FIG. 3A, trim mask 100 is disposed between a light source 106 and wafer 104. According to the illustrated embodiment, wafer 104 includes a substrate 110, a fine line region 112, and a coarse line region 114. Substrate 110 may comprise any suitable material used in the fabrication of integrated circuit devices, for example, silicon. Fine line region 112 may, for example, be disposed outwardly from substrate 110. Fine line region 112 may refer to a region of wafer 104 that includes a feature such as a gate. Coarse line region 114 is disposed outwardly from substrate 110. A coarse line region may refer to a region that does not include any active features, and may include field or interconnect regions.

Mask 100 includes an opaque region 122, a transparent region 124, and an attenuated phase-shift region 126. Opaque region 122 is disposed outwardly from substrate 120, and substantially prevents light from reaching wafer 104. Clear region 124 is disposed outwardly from substrate 120, and substantially transmits light. Attenuated phase-shift region 126 is disposed outwardly from substrate 120. Attenuated phase-shift region 126 transmits less than twelve percent of light from light source 106, and selectively shifts the phase of the transmitted light.

According to one embodiment of operation, light emitted from light source 106 travels to clear region 124, opaque region 122, and attenuated phase-shift region 126 of trim mask 110. Clear region 124 selectively transmits and opaque region 122 selectively blocks the light that patterns fine line region 112 of wafer 104. Clear region 124 selectively transmits and attenuated phase-shift region 126 selectively attenuates and phase shifts the light that patterns coarse line region 114 of wafer 104.

Referring to FIG. 3B, phase-shift mask 102 is disposed between light source 106 and wafer 104. Light emitted from light source 106 travels through phase-shift mask 102. Phase-shift mask 102 selectively modifies light 130 that patterns the fine line region 112 of wafer 104. Light source 106 for the phase exposure need not be the same as for the trim exposure.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that a trim mask may include attenuated phase-shift, opaque, and transparent regions. An attenuated phase-shift region may be used to substantially pattern a coarse line region. The attenuated phase-shift region may provide for higher precision patterning of the coarse line region than an opaque region can provide. A fine line region may be shielded from exposure by an opaque region during one exposure, and patterned by an alternating phase-shift mask during a next exposure. The opaque region may protect the fine line region from exposure to light, which may allow for effective exposure of the fine-line region by the phase-shift mask.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method of fabricating an integrated circuit using photolithography, comprising:
selectively exposing a photoresist layer to pattern a coarse line region of a layer on a wafer using a trim mask;
wherein the trim mask comprises:
a) a transparent region comprising a substantially transparent material operable to substantially transmit light;
b) an attenuated phase-shift region comprising an attenuated phase-shift material operable to attenuate and phase-shift light, the phase-shifted attenuated light operating to substantially pattern the coarse line region; and c) an opaque region comprising an opaque material operable to substantially block light; the opaque region operating to keep light from exposing the fine line region of the photoresist layer, the body of the opaque region being fully opaque, the opaque region further having tabs that project beyond a base of the opaque region to join at a boundary of the attenuated phase-shift region;

selectively exposing a same or different photoresist layer to pattern a fine line region of the layer on the wafer using an alternating phase-shift mask, wherein the alternating phase-shift mask comprises a) alternating phase-shift regions operable to transmit phase-shifted light, the transmitted alternating phase-shifted light operable to pattern substantially only the fine line region; and b) one or more alternating phase-shift regions that transmit light to pattern and overlap with at least a portion of the region left unexposed by the opaque region of said trim mask but does not substantially transmit light to pattern and overlap with the coarse line region patterned by said attenuated phase-shift region of said trim mask, wherein the trim exposure on the wafer occurs before the alternating phase exposure.

2. The method of claim 1, wherein the layer of the wafer is a layer of polysilicon.

3. The method of claim 2, wherein the fine line region is a transistor gate region, and the coarse line region is a field region.

4. The method of claim 1, wherein the fine line region is a transistor gate region and the coarse line region is an interconnect region at least partially providing external connection to the transistor region.

5. The method of claim 1, wherein the layer of the wafer is a metal layer, the fine line region defines fine interconnects, and the coarse line region defines a power bus.

6. The method of claim 1, wherein the transparent region comprises quartz, the attenuated phase-shift region comprises molybdenum silicide, and the opaque material comprises chromium.

7. The method of claim 1, wherein the transparent material forms a substrate for the trim mask; the attenuated phase-shift region comprises a layer of attenuated phase-shift material formed and patterned over the substrate; and the opaque region comprises a layer of opaque material is formed and patterned over the substrate and over or under the layer of attenuated phase-shift material.

8. The method of claim 7, wherein the transparent region comprises quartz, the attenuated phase-shift region comprises molybdenum silicide, and the opaque material comprises chromium.

9. The method of claim 1, wherein the phase of light passing through the attenuated phase-shift region is shifted by 180 degrees with respect to light passing through the transparent region.

10. The method of claim 1, wherein a boundary between the opaque region and the attenuated phase-shift region joins a fine line region with a coarse line region such that the region patterned by the attenuated phase-shift region of the trim mask and the region patterned by the alternating phase-shift mask pattern are at least partly the same regions.

11. The method of claim 1, wherein the trim mask includes tabs and wings, and the tabs extend from the opaque region to protect end projections of the fine line region.

12. The method of claim 11, wherein the tabs and the wings are defined by at least one of opaque or attenuated material.

13. The method of claim 1, wherein the alternating phase-shift mask is used to pattern at least a portion of the region or regions patterned by said trim mask.

14. The method of claim 1, wherein the opaque region further having tabs that project beyond a base of the opaque region to join at a boundary of the attenuated phase-shift region; to protect the fine line region.

15. A photolithography mask system for patterning, comprising:

a trim mask comprising:

a) a transparent region comprising a substantially transparent material and operable to substantially transmit received light;

b) an attenuated phase-shift region comprising an attenuated phase-shift material and operable to attenuate received light and shift the phase of the received light, the phase-shifted attenuated light operable to substantially pattern a coarse line region of a wafer; and c) an opaque region comprising an opaque material and operable to substantially prevent received light from exposing a fine line region of the wafer; the body of the opaque region being fully opaque, the opaque region further having tabs that project beyond a base of the opaque region to join at a boundary of the attenuated phase-shift region; and an alternating phase-shift mask operable to pattern only the fine line region, wherein the alternating phase-shift mask comprises:

a) one or more alternating phase-shift regions operable to transmit phase-shifted light, the transmitted alternating phase-shifted light operable to pattern substantially only the fine line region; and b) one or more alternating phase-shift regions that transmit light to pattern and overlap with at least a portion of the region left unexposed by the opaque region of said trim mask but does not substantially transmit light to pattern and overlap with the coarse line region patterned by said attenuated phase-shift region of said trim mask wherein the trim exposure on the wafer occurs before the alternating phase exposure.

16. The mask system of claim 15, wherein the opaque region further having tabs that project beyond a base of the opaque region to join at a boundary of the attenuated phase-shift region; to protect the fine line region.

* * * * *